US009136271B2

(12) United States Patent
Chiu et al.

(10) Patent No.: US 9,136,271 B2
(45) Date of Patent: *Sep. 15, 2015

(54) SEMICONDUCTOR DEVICE WITH ONE-TIME PROGRAMMABLE MEMORY CELL INCLUDING ANTI-FUSE WITH METAL/POLYCIDE GATE

(71) Applicant: WaferTech, LLC, Camas, WA (US)

(72) Inventors: Re-Long Chiu, Vancouver, WA (US);
Shu-Lan Ying, Camas, WA (US);
Wen-Szu Chung, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/265,742

(22) Filed: Apr. 30, 2014

(65) Prior Publication Data

US 2014/0233319 A1    Aug. 21, 2014

Related U.S. Application Data

(63) Continuation of application No. 13/941,120, filed on Jul. 12, 2013, now Pat. No. 8,743,585, which is a continuation of application No. 13/291,792, filed on Nov. 8, 2011, now Pat. No. 8,508,971.

(51) Int. Cl.
*G11C 17/00* (2006.01)
*H01L 27/112* (2006.01)
(Continued)

(52) U.S. Cl.
CPC .......... *H01L 27/11206* (2013.01); *G11C 16/10* (2013.01); *G11C 17/16* (2013.01); *H01L 29/788* (2013.01); *G11C 16/0433* (2013.01); *G11C 2216/26* (2013.01)

(58) Field of Classification Search
CPC .......... G11C 16/0425; G11C 16/0441; G11C 16/0458; G11C 17/16; H01L 27/115; H01L 27/11206
USPC ................. 365/94, 225.7, 96, 185.18, 51, 63; 257/314–316
See application file for complete search history.

(56) References Cited

U.S. PATENT DOCUMENTS 5,965,270 A    10/1999    Fang et al.
6,667,902 B2   12/2003    Peng
(Continued)

OTHER PUBLICATIONS

Cha et al., "A 32-KB Standard CMOS Antifuse One-Time Programmable ROM Embedded in a 16-bit Microcontoller," *IEEE Journal of Solid-State Circuits*, Sep. 2006, 41(9):2115-2124.
(Continued)

*Primary Examiner* — David Lam
(74) *Attorney, Agent, or Firm* — Duane Morris LLP

(57) ABSTRACT

A one-time programmable (OTP) memory cell includes a dual date transistor and, in some embodiments, two transistors. The dual gate transistor is formed using the same processing operations used to form floating gate transistors in other areas of the semiconductor device. The dual gate transistor includes an upper gate isolated from a floating gate by a floating gate oxide, the combination of which produces an anti-fuse. The nonvolatile memory device may include a plurality of such OTP memory cells and one or more OTP memory cells are selected and programmed by applying a voltage sufficient to blow the anti-fuse by causing the floating gate oxide layer to break down and the upper gate to become shorted to the floating gate.

20 Claims, 1 Drawing Sheet

(51) Int. Cl.
    *G11C 16/10*     (2006.01)
    *G11C 17/16*     (2006.01)
    *H01L 29/788*     (2006.01)
    *G11C 16/04*     (2006.01)

(56) References Cited

U.S. PATENT DOCUMENTS

| | | | |
|---|---|---|---|
| 6,671,040 B2 | 12/2003 | Fong et al. | |
| 7,042,772 B2 | 5/2006 | Wang et al. | |
| 7,542,367 B2 * | 6/2009 | Matsufuji et al. | 365/225.7 |
| 8,395,923 B2 | 3/2013 | Chen et al. | |
| 8,743,585 B2 * | 6/2014 | Chiu et al. | 365/94 |

OTHER PUBLICATIONS

Chen et al., "A New Antifuse Cell With Programmable Contact for Advance CMOS Logic Circuits," *IEEE Electron Device Letters*, May 2008, 29(5):522-524.

DeLoge et al., "Lifetime and Wearout Current Modeling of Ulta-thin Oxice Antifuse Bitcells Using Transient Characterization," STMicroelectronics, Crolles, France, 2010, 2010 IEEE International Memory Workshop, May 16-19, 2010, Seoul, pp. 1-4.

Kaku et al., "A Field Programmable 40-nm Pure CMOS Embedded Memory Macro using a PMOS Antifuse," System LSI Design Department, Toshiba Corporation, 580-1, Horikawa-cho, Saiwai-ku, Kawasaki-shi, 212-8520, Japan, *IEEE Asian Solid State Circuits Conference*, Nov. 15-18, 2009, Taipei, Taiwan, pp. 217-220.

Peng et al., "A Novel Embedded OTP NVM Using Standard Foundry CMOS Logic Technology," Kilopass Technology, Inc., Santa Clara, CA, *IEEE NVSMW 2006, 21st Non-Volatile Semiconductor memory Workshop*, 2006, Monterey, CA, Dec. 16, 2006, pp. 24-26.

Matsufuji et al., "A 65-nm Pure CMOS One-time Programmable Memory Using a Two-Port Antifuse Cell Implemented in a Matrix Structure," 580-1, Horikawa-cho, Saiwai-ku, Kawasaki-shi, 212-8520, Japan, System LSI Design Department, Toshiba Corporation, *IEEE Asian Solid-State Circuits Conference*, Nov. 2-14, 2007, Jeju, Korea, pp. 212-215.

* cited by examiner

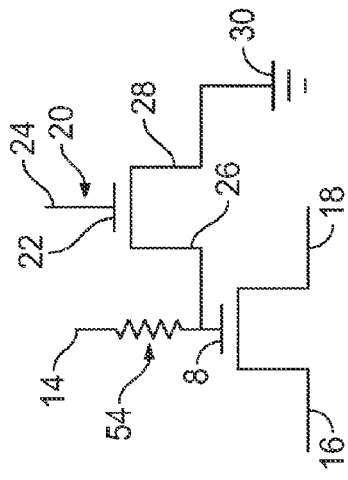
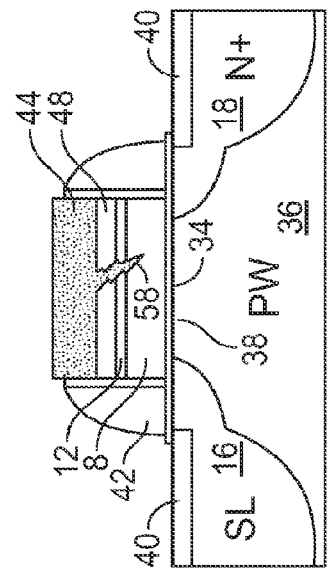
FIG. 2A
FIG. 2B
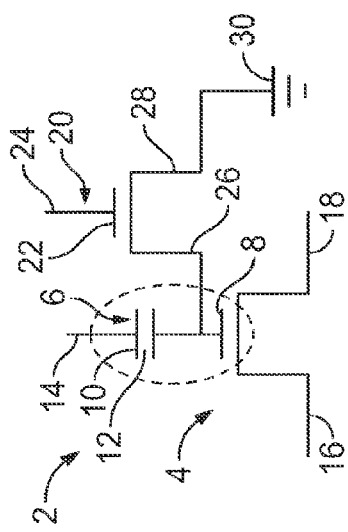
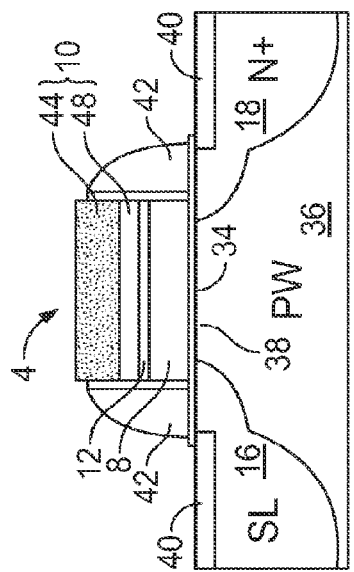
FIG. 1A
FIG. 1B

SEMICONDUCTOR DEVICE WITH ONE-TIME PROGRAMMABLE MEMORY CELL INCLUDING ANTI-FUSE WITH METAL/POLYCIDE GATE

RELATED APPLICATION

This application is a continuation of U.S. patent application Ser. No. 13/941,120, filed on Jul. 12, 2013, which is a continuation of U.S. patent application Ser. No. 13/291,792, filed on Nov. 8, 2011, now U.S. Pat. No. 8,508,971, the contents of each of which are incorporated herein by reference as if set forth in their entireties.

TECHNICAL FIELD

The disclosure relates to a one-time programmable memory cell for a semiconductor device.

BACKGROUND

Nonvolatile memory retains stored data when power is removed, which is required or at least highly desirable in many different types of computers and countless other electronic devices. Nonvolatile memory devices have therefore always been one of the more predominant devices fabricated in semiconductor manufacturing facilities.

Various types of nonvolatile memory (NVM) technologies exist. Most nonvolatile memory devices such as programmable read-only memory (PROM), electrically programmable read-only-memory (EPROM), electrically erasable programmable ROM (EEPROM) flash EEPROM's or other electric memory devices require additional processing operations which increases costs, increases the likelihood of mis-processing and requires a longer manufacturing time. Additionally, there are various types of one-time programmable (OTP) memory technologies in the market today that represent embedded nonvolatile memory (NVM) technologies. The main OTP memory technologies include mask ROM, floating gate, electrical fuse and anti-fuse. Anti-fuse devices have been in the market for several decades in the semiconductor industry for one-time programmable devices and typically use separately created metal/insulator/metal (MIM) structures or polysilicon/dielectric/diffusion area structures. Additional, dedicated process steps are required to create these nonvolatile memory elements. As has always been the case in semiconductor device manufacturing, there is also an ongoing drive to produce smaller, more highly integrated devices that require less space and this applies to all device structures including NVM cells.

It would therefore be desirable to create a compact NVM cell that utilizes the processing operations used to produce other semiconductor structures and which does not require separate dedicated processing operations simply to form the NVM.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 1A and 1B illustrate a circuit diagram of an exemplary one-time programmable memory cell and a cross-sectional view of an exemplary dual-gate transistor of the memory cell, prior to programming; and FIGS. 2A and 2B illustrate a circuit diagram of an exemplary one-time programmable memory cell and a cross-sectional view of an exemplary dual-gate transistor of the memory cell, after programming.

DETAILED DESCRIPTION

The disclosed one-time programmable memory cell includes a dual-gate transistor structure that may be formed using the same sequence of processing operations also used to simultaneously form floating gate transistors. The one-time programmable memory cell may be a part of an integrated circuit or other semiconductor device and will be formed on a semiconductor substrate utilizing the sequence of processing operations used to form floating gate transistors and other structures for the integrated circuit or other semiconductor device, on the semiconductor substrate. The one-time programmable memory cell is a highly integrated cell with a small footprint and may be a two-transistor, 2T, cell according to one exemplary embodiment. The dual-gate transistor includes a floating gate that is initially isolated from an upper gate and this structure functions as an anti-fuse.

A plurality of such one-time programmable (OTP) memory cells may be formed in the integrated circuit or other semiconductor device formed on the semiconductor substrate. The integrated circuit may include other structures such as floating gate transistors also formed using the same sequence of processing operations that form the OTP memory cells. The integrated circuit and the OTP memory cells are appropriately wired to power and voltage sources using conventional or newly-developed techniques and are wired such that a desired one of the OTP memory cells can be selected and selectively programmed as will be discussed below.

FIGS. 1A and 1B show a circuit diagram of the OTP memory cell and a cross-sectional illustration of the dual gate transistor used in the OTP memory cell, respectively, before programming, and FIGS. 2A and 2B correspond to FIGS. 1A and 1B and illustrate the OTP memory cell and dual gate transistor after programming.

FIG. 1A is a circuit diagram of an exemplary one-time programmable, OTP, memory cell according to the disclosure. In the exemplary embodiment, OTP memory cell 2 includes two transistors and five terminals and represents a nonvolatile memory device. OTP memory cell 2 includes dual-gate transistor 4. Dual-gate transistor 4 includes anti-fuse 6. Dual-gate transistor 4 includes floating gate 8 and upper gate 10 which may be a metal/polycide gate or it may be a metal/polysilicon gate. In the circuit diagram shown in FIG. 1A before programming, floating gate 8 is separated from upper gate 10 by an insulating structure which will be shown to be second oxide layer 12 in FIG. 1B. As will be seen in FIGS. 2A, 2B, the programming mechanism will cause second oxide layer 12 to break down resulting in ohmic contact between upper gate 10 and floating gate 8. Still referring to FIG. 1A, dual-gate transistor 4 may include upper gate 10 coupled to a first word line 14, source/drain 16 coupled to a source line and source/drain 18 coupled to a first bit line. Second transistor 20 is a single-gate transistor and includes gate 22 which may be coupled to a second word line 24. Source/drain 26 is coupled to floating gate 8 of dual-gate transistor 4 and source/drain 28 may be coupled to a second bit line or to ground 30 as in the illustrated embodiment. The structures may be fabricated and interconnected using well-known or other suitable materials. The word lines, bit lines and signal lines may be formed of various suitable conductive materials such as copper, aluminum, and their alloys. Although only one OTP memory cell 2 is illustrated in FIG. 1A, a plurality of such OTP memory cells are fabricated simultaneously in a semiconductor device and may be arranged in arrays or other suitable configurations.

The cross-sectional illustration of FIG. 2 shows aspects of dual-gate transistor 4. Dual-gate transistor 4 is formed on semiconductor substrate 36, which may be silicon or other suitable materials. A complete semiconductor device such as an integrated circuit is formed as a chip or die on semiconductor substrate 36 and dual-gate transistor 4 is included as part of OTP memory cell 2 in the integrated circuit or other semiconductor device. Dual-gate transistor 4 includes gate dielectric 34, which may be an oxide or other suitable gate dielectric material. Gate dielectric 34 is formed over channel region 38 and may alternatively be a high-k or low-k dielectric material. Gate dielectric 34 may include a thickness ranging from about 10-300 angstroms, but other thicknesses may be used in other exemplary embodiments. Dual-gate transistor 4 includes floating gate 8, which may advantageously be formed of polysilicon or other suitable materials, and may include a thickness ranging from about 500-1500 angstroms, but other thicknesses may be used in other exemplary embodiments, depending upon the application and other device dimensions. Second oxide layer 12 is formed over floating gate 8 and may be a floating gate oxide or other oxide in various exemplary embodiments. The thickness of second oxide layer 12 is chosen in conjunction with the programming voltage that will be used to blow the anti-fuse and program the cell. In various exemplary embodiments, second oxide layer 12 may include a thickness ranging from 20 angstroms-500 angstroms, but other thicknesses may be used in other exemplary embodiments.

Upper gate 10 is a composite material including upper metal portion 44 and lower portion 48. Upper metal portion 44 may be aluminum, copper, tungsten, titanium, cobalt or other suitable materials, and lower portion 48 may be polysilicon or it may be polysilicon that has reacted with metal to form a polycide, i.e. a polysilicide material. In the illustrated embodiment, upper gate 10 and floating gate 8 include the same width and are aligned over one another. In active floating gate transistors formed on other areas of the substrate, i.e. in other locations of the integrated circuit or other semiconductor device that includes a plurality of OTP memory cells 2, upper gate 10 may serve as a control gate in such floating gate transistors. The control gate is electrically insulated from the floating gate of the floating gate transistors, and may be wider than the floating gate as the control gate may extend over and alongside the floating gate.

Still referring to FIG. 1B, spacers 42 are formed alongside the composite gate of dual-gate transistor 4 and may be formed of various suitable dielectric materials such as silicon nitrides, silicon oxynitrides, and silicon oxides. Spacers 42 may represent a composite spacer of two separate materials such as in the illustrated embodiment. In other exemplary embodiments, spacers 42 may be formed of a single material. Dual-gate transistor 4 includes source/drains 16 and 18 and contact layers 40, which may be metal silicides although other suitable contact materials may be used in other exemplary embodiments. Source/drains 16 and 18 may be N-type materials according to one embodiment in which dual-gate transistor 4 is formed over a P-well portion of semiconductor substrate 36. According to other exemplary embodiments, the dopant polarities may be reversed, i.e. source/drains 16 and 18 may be P-type materials formed over an N-well portion of semiconductor substrate 36.

The structure shown in FIGS. 1A and 1B is then programmed. OTP memory cell 2 such as illustrated in FIG. 1A, may be part of an array or another plurality of OTP memory cells situated on a substrate. For the OTP memory cell or cells that are desired to be programmed, they are first selected by identifying the appropriate wiring interconnects coupled to the desired OTP memory cell or cells, and then programmed.

The OTP memory cell or cells is/are programmed by supplying sufficient voltage to cause upper metal portion 44 to spike through second oxide layer 12 and provide ohmic contact between upper gate 10 and floating gate 8, according to the exemplary embodiment illustrated in FIG. 2B, as will be discussed below. In one exemplary embodiment, this may be accomplished by the use of an internal charge pump circuit embedded in the integrated circuit or other semiconductor device that includes the OTP memory cell or cells. According to another exemplary embodiment, an external programming voltage $V_{pp}$ may be applied to program the selected OTP memory cell or cells. In the circuit diagram shown in FIG. 1A, OTP memory cell 2 has five terminals including a source line such as may be coupled to source/drain 16, two word lines 14, 24 and two bitlines coupled to source/drain 18 and 28 in one exemplary embodiment. Source/drain 28 may be coupled to ground 30 according to another exemplary embodiment such as illustrated in FIG. 1A. Programming refers to the process of selectively causing anti-fuse 6 of dual gate transistor 4 to become blown as shown in FIGS. 2A and 2B. According to an exemplary embodiment in which an external programming voltage $V_{pp}$ is used to program OTP memory cell 2, $V_{dd}$ may be applied to second word line 24 and $V_{pp}$ may be applied to first word line 14. $V_{pp}$ may have a value ranging from 1 volt to 30 volts and may be applied in 50 millisecond pulses and in other exemplary embodiments, $V_{pp}$ may be applied in pulses ranging in duration from 100 nanoseconds to 1 second.

FIG. 2A shows that first word line 14 is coupled to floating gate 8 through resistor 54. Resistor 54 represents upper gate 10 now shorted to floating gate 8. In this manner, ohmic contact is made between upper gate 10 and first word line 14, and floating gate 8 after the anti-fuse has been blown. FIG. 2B shows dual gate transistor 4 of FIG. 1B after anti-fuse 6 of FIG. 1A has been blown. When sufficient programming voltage has been applied, metal spike 58 breaks through second oxide layer 12 thereby blowing the original anti-fuse 6. In the illustrated embodiment, metal materials from upper metal portion 44 spike through second oxide layer 12 and into floating gate 8 but in other exemplary embodiments, material from lower portion 48 may spike through second oxide layer 12, particularly according to embodiments in which lower portion 48 is a polycide material.

The composition and dimensions of the materials that form dual gate transistor 4 are chosen in conjunction with the programming voltage that will be used and to enable the applied programming voltage to program the OTP memory cell 2 by blowing anti-fuse 6. One advantageous aspect of the disclosed OTP memory cell 2 is that it is immune to radiation, UV light, and data retention and write/read disturbances as the programming occurs by the formation of ohmic contact without charge trapping. Applications for the disclosed OTP memory cells include but are not limited to memory redundancy, RF circuit trimming, security coding, low-bit-count electrical labeling, MCU (microcontroller unit) code storage, analog IC encryption code trimming and parameter setting.

According to one aspect, the disclosure provides a two transistor, anti-fuse OTP cell structure with one of the transistors being a dual-gate transistor.

The disclosure provides a semiconductor device comprising a plurality of one-time programmable memory cells, each memory cell comprising: a dual gate transistor having a channel, a gate dielectric disposed over the channel, a floating gate disposed over the gate dielectric, a floating gate oxide disposed over the floating gate and an upper gate comprising a metal and one of polysilicon and a silicide, disposed over the floating gate oxide and coupled to a first word line. Each memory cell also comprises a further transistor having a gate coupled to a second word line, a source coupled to a first bit line and a drain coupled to the floating gate, the dual gate transistor having a source coupled to a signal line and a drain coupled to one of a second bit line and ground.

Also provided is a method for programming a one-time programmable memory cell. The method comprises: providing a memory cell including a dual gate transistor having a channel, a gate dielectric disposed over the channel, a floating gate disposed over the gate dielectric, a floating gate oxide disposed over the floating gate, and an upper gate comprising a metal and one of polysilicon and a silicide, disposed on the floating gate oxide. The method further provides programming the memory cell by causing the floating gate oxide to break down and the upper gate to become shorted to the floating gate by applying a voltage sufficient to break down the floating gate oxide across the floating gate oxide.

Also provided is a method for programming one-time programmable memory cells. The method comprises: providing a plurality of memory cells, each memory cell comprising a dual gate transistor having a channel, a gate dielectric disposed over the channel, a floating gate disposed over the gate dielectric, a floating gate oxide disposed over the floating gate and an upper gate comprising a metal and polysilicon or a silicide, disposed over the floating gate oxide. The method further comprises: selecting a first memory cell of the plurality of memory cells to be programmed; and programming the first memory cell by causing the floating gate oxide to break down and the upper gate to become shorted to the floating gate by applying a sufficient voltage across the upper gate and the floating gate in the first memory cell.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A semiconductor device comprising a plurality of one-time programmable memory cells, each said memory cell comprising:
    a dual gate transistor having a floating gate oxide disposed over a floating gate and an upper gate disposed over said floating gate oxide and electrically coupled to said floating gate by a metal spike that extends through said floating gate oxide; and
    a further transistor having a drain coupled to said floating gate.

2. The semiconductor device as in claim 1, wherein said upper gate includes a silicide layer beneath a metal layer and said metal spike extends from said metal layer.

3. The semiconductor device as in claim 1, wherein said dual gate transistor has a source coupled to a signal line and a drain coupled to one of a bit line and ground and said metal layer comprises Al or Co.

4. The semiconductor device as in claim 3, wherein said upper gate is coupled to a first word line electrically coupled to $V_{pp}$ and said further transistor has a gate coupled to a second word line electrically coupled to $V_{dd}$.

5. The semiconductor device as in claim 1, wherein said further transistor has a gate coupled to a word line and a source coupled to a bit line.

6. The semiconductor device as in claim 5, wherein said dual gate transistor includes said upper gate coupled to a further word line.

7. The semiconductor device as in claim 6, wherein said word line is electrically coupled to $V_{dd}$ and said further word line is electrically coupled to $V_{pp}$.

8. The semiconductor device as in claim 1, wherein each said memory cell includes each of said dual gate transistor and said further transistor wired to voltage and power sources and said metal layer comprises Ti, Cu or W.

9. A semiconductor device comprising a plurality of one-time programmable memory cells, each said memory cell comprising:
    a dual gate transistor having a floating gate oxide disposed over a floating gate and an upper gate disposed over said floating gate oxide and electrically coupled to said floating gate by a metal spike that extends through said floating gate oxide,
    wherein said upper gate includes a metal layer and a layer beneath said metal layer and said metal spike extends from said metal layer.

10. The semiconductor device as in claim 9, wherein said dual gate transistor includes said floating gate coupled to a word line and further comprising a further transistor having a gate coupled to a further word line, a source coupled to a bit line and a drain coupled to said floating gate.

11. The semiconductor device as in claim 10, wherein each said memory cell includes each of said dual gate transistor and said further transistor wired to voltage and power sources.

12. The semiconductor device as in claim 9, wherein said metal layer comprises one of Ti, Al, Co, Cu and W.

13. The semiconductor device as in claim 9, wherein said floating gate is formed of polysilicon, said upper gate and said floating gate include the same width and are aligned over one another, and said floating gate and said upper gate are insulated from one another by said floating gate oxide disposed therebetween.

14. A method for programming a one-time programmable memory cell, said method comprising:
   programming a memory cell including a dual gate transistor having an upper gate disposed on a floating gate oxide disposed over a floating gate, by causing said floating gate oxide to break down.

15. The method as in claim 14, wherein said upper gate includes a metal layer over a further layer.

16. The method as in claim 15, wherein said causing said floating gate oxide to break down is accomplished by applying a voltage sufficient to break down said floating gate oxide, across said floating gate oxide, and wherein said causing causes a metal portion of said metal layer to spike through said floating gate oxide thereby shorting said upper gate to said floating gate.

17. The method as in claim 15, wherein said metal layer comprises Ti, W or Co and said further layer comprises a polycide.

18. The method as in claim 15, wherein said metal layer comprises Al or Cu.

19. The method as in claim 14, wherein said memory cell includes said upper gate coupled to a first word line, said dual gate transistor having a source/drain coupled to a signal line and a further source/drain of said dual gate transistor coupled to a first bit line or ground, and said memory cell further comprises a further transistor having a gate coupled to a second word line, a source/drain coupled to a second bit line and a further source/drain coupled to said floating gate, and
   wherein said programming comprises applying $V_{pp}$ to said first word line and applying $V_{dd}$ to said second word line.

20. The method as in claim 19, wherein said applying $V_{pp}$ comprises applying said $V_{pp}$ in pulses.

\* \* \* \* \*